United States Patent
Vilander

(10) Patent No.: US 9,646,762 B2
(45) Date of Patent: May 9, 2017

(54) LOW CROSSTALK MAGNETIC DEVICES

(71) Applicant: Nokia Corporation, Espoo (FI)

(72) Inventor: Ari Vilander, Vantaa (FI)

(73) Assignee: Nokia Technologies Oy, Espoo (FI)

( * ) Notice: Subject to any disclaimer, the term of this patent is extended or adjusted under 35 U.S.C. 154(b) by 318 days.

(21) Appl. No.: 14/581,162

(22) Filed: Dec. 23, 2014

(65) Prior Publication Data

US 2016/0181009 A1   Jun. 23, 2016

(51) Int. Cl.
*H01F 27/42* (2006.01)
*H01F 27/34* (2006.01)

(52) U.S. Cl.
CPC ........... *H01F 27/346* (2013.01); *H01F 27/42* (2013.01)

(58) Field of Classification Search
CPC ............................ H01F 27/42; H01F 27/346
USPC ......................................................... 361/159
See application file for complete search history.

(56) References Cited

U.S. PATENT DOCUMENTS

| | | | |
|---|---|---|---|
| 7,151,430 B2 | 12/2006 | Mattsson | |
| 7,755,464 B2 * | 7/2010 | Hisamitsu | ........... H01F 17/0006 336/200 |
| 9,509,273 B2 * | 11/2016 | Andersson | .............. H01F 27/42 |
| 2003/0231093 A1 | 12/2003 | Hsu et al. | |
| 2009/0250262 A1 | 10/2009 | Jin | |
| 2014/0140028 A1 | 5/2014 | Lenive | |

FOREIGN PATENT DOCUMENTS

| | | |
|---|---|---|
| EP | 2273613 A1 | 1/2011 |
| WO | WO-2005/010543 A1 | 2/2005 |
| WO | WO-2015/069815 A1 | 5/2015 |

OTHER PUBLICATIONS

Bhagat; May 14, 2015; WO-2015/069815; Abstract, Figures, Entire specification.*
Nazarian; Jan. 12, 2011; EP 2 273 613; Abstract, Figures, Entire specification.*

* cited by examiner

*Primary Examiner* — Dharti Patel
(74) *Attorney, Agent, or Firm* — Mintz Levin Cohn Ferris Glovsky and Popeo, P.C.

(57) ABSTRACT

In one aspect there is an apparatus. The apparatus may include an electronic circuit that generates a first magnetic field from a current in the electronic circuit. The apparatus may further include a sensing circuit separated from the electronic circuit by a predetermined distance to sense the first magnetic field. A cage circuit may cancel a portion of the first magnetic field at the sensing circuit. The cage circuit may generate a cage current from the current in the electronic circuit and at least one of a phase shift or an amplitude shift applied to the current in the electronic circuit. The cage current may generate a second magnetic field causing cancellation of the portion of the magnetic field from the electronic circuit at the sensing circuit.

15 Claims, 7 Drawing Sheets

LOW CROSSTALK MAGNETIC DEVICES

FIELD

The subject matter described herein relates to inductors, baluns, and transformers.

BACKGROUND

Many modern computing/communications devices are mobile. These devices include a wide variety of consumer and industrial products including cell phones, handheld computing devices, laptops, printers, and the like. As these mobile devices are moved, the interference environment of a mobile device may change depending on other nearby devices. In some environments, cross-talk from components in the mobile device may cause information being carried on the mobile device to be received on another device causing a data security problem.

Cross-talk may arise from magnetic electrical components that are used in most consumer and industrial electronic systems. For example, magnetic components such as inductors, baluns, and transformers are used in power conversion and radio frequency circuits. Due to the very nature of magnetic devices, magnetic fields are generated that extend beyond the magnetic device. In some applications, the spatial extend of the magnetic field may cause cross-talk to other magnetic devices or circuit elements nearby in the same computing/communications device or in a different device. Reducing magnetic cross-talk between electronic components may improve circuit performance including efficiency and data security.

SUMMARY

In some example embodiments, there is provided an apparatus. The apparatus may include an electronic circuit that generates a first magnetic field from a current in the electronic circuit. The apparatus may further include a sensing circuit separated from the electronic circuit by a predetermined distance to sense the first magnetic field. A cage circuit may cancel a portion of the first magnetic field at the sensing circuit. The cage circuit may generate a cage current from the current in the electronic circuit and at least one of a phase shift or an amplitude shift applied to the current in the electronic circuit. The cage current may generate a second magnetic field causing cancellation of the portion of the first magnetic field at the sensing circuit.

In some variations, one or more of the features disclosed herein including the following features can optionally be included in any feasible combination. The electronic circuit may include a first inductor, the cage circuit may comprise a second inductor, the sensing circuit may comprise a third inductor, and the second inductor may physically circumscribe the first inductor or the third inductor. The at least one of the gain adjustment or the phase adjustment may comprise a fixed gain adjustment value or a fixed phase adjustment value. The at least one of the gain adjustment and the phase adjustment may comprise a time-varying gain adjustment value or a time-varying phase adjustment value. The electronic circuit may include at least one of a planar inductor configured as a spiral inductor, a differential spiral inductor, or a transformer. The electronic circuit may comprise a plurality of inductors. The apparatus may further comprise at least another cage circuit passing at least another cage current that produces a fourth magnetic. The at least another cage current may be generated from the current in another electronic circuit and at least another phase shift or another amplitude shift applied to the current in the other electronic circuit. The at least another cage current may generate at least a third magnetic field to cancel at least another portion of the fourth magnetic field at the sensing circuit. The at least another cage circuit may cause cancellation of the at least another portion of the fourth magnetic field at the sensing circuit.

In some example embodiments, an apparatus may provide a means for generating a first magnetic field from a current in an electronic circuit. The apparatus may further provide a means for sensing the first magnetic field by a sensing circuit separated from the electronic circuit by a predetermined distance. The apparatus may further provide a means for generating a cage current from the current and at least one of a phase shift or an amplitude shift applied to the current, wherein the cage current may generate a second magnetic field in a cage circuit to cancel at least a portion of the first magnetic field at the sensing circuit. The apparatus may provide a means for causing, by the cage circuit, cancellation of the at least the portion of the magnetic field from the electronic circuit at the sensing circuit. The apparatus may further provide a means for generating at least another cage current from another current in another electronic circuit and at least another phase shift or another amplitude shift applied to the other current, wherein the other current generates a fourth magnetic field, and wherein the at least another cage current generates at least a third magnetic field in at least another cage circuit to cancel at least another portion of the fourth magnetic field at the sensing circuit. The apparatus may further provide a means for causing, by the at least another cage circuit, cancellation of the at least the other portion of the fourth magnetic field at the sensing circuit. The electronic circuit may comprise a first inductor, the cage circuit may comprise a second inductor, and the sensing circuit may comprise a third inductor. The second inductor may physically circumscribe the first inductor or the third inductor. The at least one of the gain adjustment or the phase adjustment may comprise a fixed gain adjustment value or a fixed phase adjustment value. The at least one of the gain adjustment and the phase adjustment may comprise a time-varying gain adjustment value or a time-varying phase adjustment value. The electronic circuit may include a spiral inductor, a differential spiral inductor, an octagonal inductor, any other planar inductor, or any transformer. The electronic circuit may comprise a plurality of inductors.

The above-noted aspects and features may be implemented in systems, apparatuses, methods, and/or computer-readable media depending on the desired configuration. The details of one or more variations of the subject matter described herein are set forth in the accompanying drawings and the description below. Features and advantages of the subject matter described herein will be apparent from the description and drawings, and from the claims. In some exemplary embodiments, one of more variations may be made as well as described in the detailed description below and/or as described in the following features.

Figure 1:
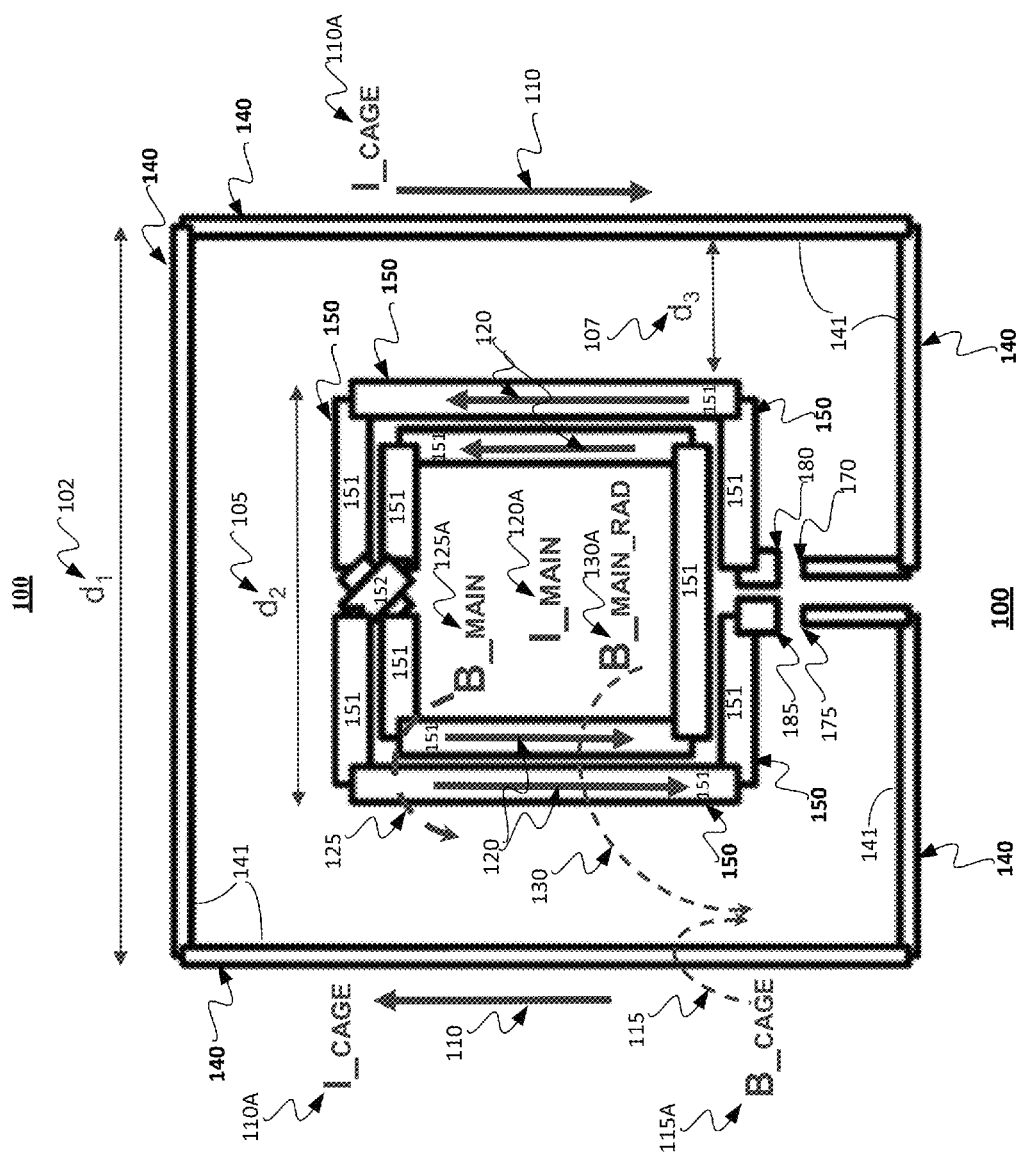
FIG. 1 depicts an example of an inductor layout and a cage layout, in accordance with some example embodiments.

Like labels are used to refer to the same or similar items in the drawings.

DETAILED DESCRIPTION

Magnetic devices such as inductors, baluns, and transformers are used in most modern electronics including radio frequency equipment and computing equipment. For example, inductors are commonly used in radio frequency circuits in cell phones, and smartphones in 2G/3G/4G/5G cellular systems, WiFi devices, and many other wireless access technologies. Inductors are also used in many computing devices such as desktop computers, laptop computers, tablet computers, netbooks, and may other types of computers.

Inductors and transformers generate magnetic fields by their very nature. When these magnetic fields spatially extend beyond the inductor to another inductor, another component, or a wire, the magnetic field may couple energy to other inductor/component/wire. The coupled energy may be referred to as cross-talk. The spatial extent of the magnetic field may depend on the design of the inductor and the current flowing through the inductor.

In some example embodiments of the subject matter disclosed herein, a cage may surround an inductor to reduce the spatial extend of the magnetic field of the inductor.

In some example embodiments, the cage may surround the inductor and a current may be passed through the cage that cancels or nearly cancels the magnetic field from the inductor. In some example embodiments, the cage may surround the inductor and a current may be passed through the cage that partly or completely cancels the magnetic field from the inductor. Cancelling the magnetic field may include cancelling or reducing an amplitude of the magnetic field via destructive interference or superposition of opposing magnetic fields.

In some example embodiments, the cage may cancel the magnetic field at a predetermined location such as the location of another magnetic component.

FIG. 1 depicts a primary inductor 150 and surrounding cage 140, in accordance with some example embodiments. Cage 140 may be a loop inductor surrounding primary inductor 150. A current 110 may be driven through cage 140 to generate a magnetic field 115 that cancels the magnetic field 130 from primary inductor 150. In some example embodiments, a phase shift and amplitude adjustment to an input signal may determine the current in cage 140 to cancel the magnetic field 130 from primary inductor 150. In some example embodiments, the phase shift and amplitude adjustment may include a phase shift with a fixed value and/or a amplitude adjustment with a fixed value. In some embodiments, the phase shift and amplitude adjustment may be changed over time to cancel a changing magnetic 130 field generated by primary inductor 150.

Primary inductor 150 may include strips of conductor 151 arranged to form a spiral with one or more crossovers 152 (one crossover 152 shown in FIG. 1). In some example embodiments, primary inductor 150 may be configured in a square shape with the length of a side being $d_2$ 105, or slightly more along the side with a crossover 152. For example, $d_2$ 105 may be 244 microns or any other length. Primary inductor 150 may have any other shape such as a round shape. Primary inductor 150 may be produced using a printed circuit board process with two or more conductive layers such as a two-sided FR4 printed circuit board. Inductor 150 may be produced on a radio frequency or microwave or millimeter wave frequency substrate such as alumina with two or more conductor layers. Any other substrate such as a semiconductor substrate may also be used. The crossover 152 may allow both ports 185 and 180 primary inductor 150 to be accessible on the same conductive layer.

A current 120 may flow into port 180, and then follow the path of conductors 151 to port 185. Current flow 120 with magnitude I_MAIN 120A may cause magnetic field 125 and magnetic field 130 with flux densities B_MAIN 125A and B_MAIN_RAD 130A. A higher current magnitude 120A may cause a stronger magnetic fields and flux densities. The direction of current 120 may cause the direction of magnetic fields 125 and 130. The flux density created by current 120 may be higher closer to conductors 151 shown at 125, and the flux densities may be lower farther away from conductors 151 shown at 130.

Cage 140 may include strips of conductor 141 arranged to surround inductor 150. In some embodiments, cage 140 may be arranged with one or more spirals (one loop or spiral shown in FIG. 1). In some example embodiments, cage 140 may be configured in a square shape with the length of a side being $d_1$ 102. For example, $d_1$ 102 may be 434 microns or any other length. Cage 140 may have any other shape such as a round shape. Cage 140 may be produced using the same process as primary inductor 150. In some example embodiments where cage 140 comprises a single loop, both cage ports 170 and 175 may be accessible on one conductive layer without a crossover 152.

A current 110 may flow into port 175, and then along the path of conductors 141 to port 170. Current flow 110 with magnitude I_CAGE 110A may cause magnetic field 115 with flux density B_CAGE_RAD 115A. Any other type of inductor may be used at 140 instead of a single loop.

The magnitude and phasing of current 110 may be chosen to cause magnetic field 115 to cancel magnetic field 130 produced by inductor 150. When the current in inductor 150 is time-varying, the magnetic field 130 is time-varying. In some example embodiments, the magnitude, phasing, and time-varying features of current 110 may be determined to cause cage magnetic field 115 to cancel magnetic field 130. By cancelling magnetic field 130, magnetic coupling from inductor 150 to other magnetic devices and electronic components outside inductor 150 and cage 140 may be reduced or eliminated. In some embodiments, reducing the magnetic coupling from inductor 150 may reduce interference, improve sensitivity of other components due to the reduced interference, and/or allow for more compact circuits. By reducing the magnetic coupling from inductor 150, other magnetic components such as other inductors, baluns (balanced-unbalanced), and transformers may be placed closer to inductor 150 without the coupling and/or performance degradation that would occur if cage 140 did not cancel the magnetic field form inductor 150. In some example embodiments, cage 140 may cancel at a predetermined location the magnetic field 130 from primary inductor 150.

In some example embodiments, the current generating magnetic field 115 to cancel magnetic field 130 may be determined from current 120A applied to inductor 150. For example, I_CAGE 110A may be determined from I_MAIN 120A by adjusting one or more of the magnitude, phase, and time-varying features of the current I_CAGE 110A compared to I_MAIN 120A. Adjustments to current I_CAGE 110A may accommodate any amplitude and phase shift due to the circuits driving inductor 150 and/or cage 140, and due to the distance $d_3$ 107 between inductor 150 and cage 140. In some example embodiments, the adjustments to I_CAGE 110A may accommodate the distances between primary inductor 150, cage 140, and a predetermined location where the magnetic field 130 is to be cancelled by cage magnetic field 115. In some example embodiments, the amplitude and phase shift needed to cause the magnetic field 115 caused by I_CAGE 110A to cancel magnetic field 130 form inductor 150 may be determined by measurement or by electromagnetic simulation. For example, the phase shift and amplitude adjustment from I_MAIN 120A to I_CAGE 110A may be determined by measuring the magnetic field at one or more points in an area surrounding primary inductor 150 and cage 140. In some example embodiments, the measurements may be made on a circuit including primary inductor 150 and cage 140 using engineering laboratory test equipment. In another example, the phase shift and amplitude adjustment from I_MAIN 120A to I_CAGE 110A may be determined using an electromagnetic simulation tool by simulating the magnetic fields 115 and 130 based on a physical model of primary inductor 150 and cage 140.

In some example embodiments, the current I_CAGE 110A generating magnetic field 115 in order to cancel magnetic field 130 may be determined from a sensing component such as another inductor placed a predetermined distance away from primary inductor 150 and cage 140. Some example embodiments consistent with an inductor used as a sensing component are further described below with respect to FIGS. 3-5.

In some embodiments, the current to generate magnetic field 115 that will cancel magnetic field 130 may be determined from a sensing circuit such as a voltage-controlled oscillator operating at a frequency close to a frequency of the current driving inductor 150. In some example embodiments, the frequency of the voltage controlled-oscillator may shift to a frequency close to the frequency of the signal in inductor 150 due to magnetic field 130 from primary inductor 150. In some example embodiments, the amplitude and phase shift needed between current 120A and 110A to drive cage current 110 to cancel the magnetic field 130 may be determined from the frequency shifted signal in the voltage controller oscillator.

Primary inductor 150 is shown in FIG. 1 as a differential spiral inductor but may be any other type of inductor as well. Cage 140 may be an inductor and is shown in FIG. 1 as a single loop but may be any other quantity of loops or spirals or other type of inductor as well. Examples of other inductor types for primary inductor 150 and/or cage 140 include conventional spiral inductors, multilayer spiral inductors, multi-layer differential inductors, and differential inductors with multiple cross-overs, to name a few. Any other planar or 3-D inductor may be used as well.

Figure 2:
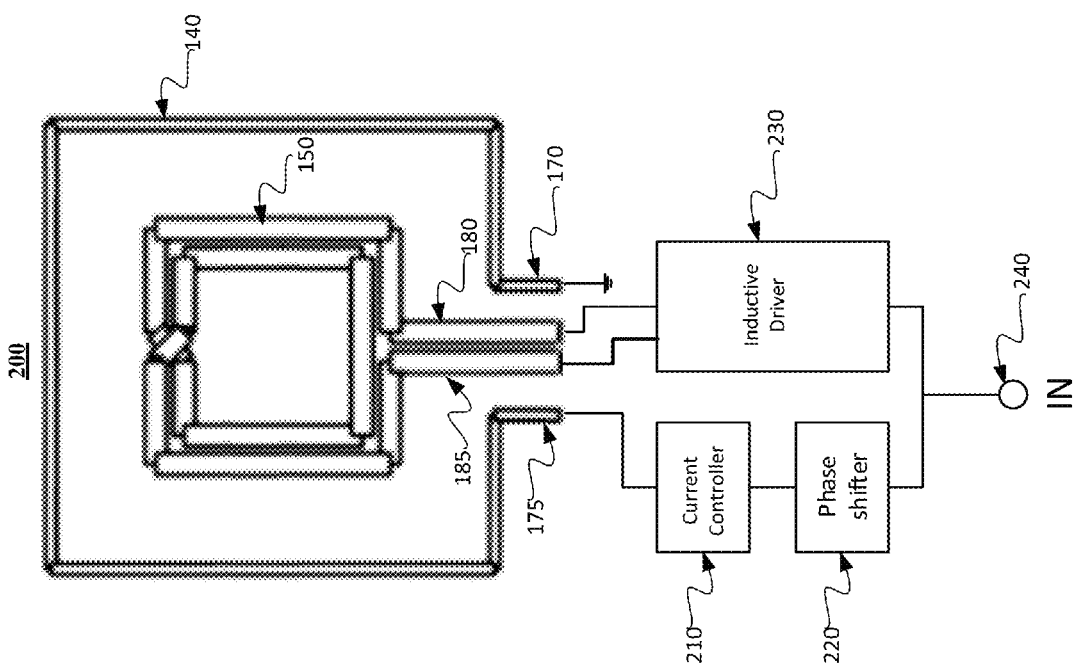
FIG. 2 depicts an example of an apparatus including an inductor, a cage, and drive electronics, in accordance with some example embodiments

FIG. 2 depicts an example of an apparatus including a primary inductor, a cage, and drive electronics, in accordance with some example embodiments. Input signal 240 may provide an input to inductive driver 230, which may in turn drive primary inductor 150. Input signal 240 may be phase shifted by phase shifter 220 and amplitude shifted by current controller 210 which in turn may drive cage 140. In some example embodiments, the current may be driven in cage 140 so that magnetic field 115 generated by cage 140 may cancel magnetic field 130 from primary inductor 150. FIG. 2 also refers to FIG. 1.

Input signal 240 may provide an input to inductive driver 230 which in turn may drive inductor 150. For example, input signal 240 may be an inductive drive signal in a circuit such as a local oscillator, amplifier, or other circuit. Primary inductor 150 may be one of the components of the local oscillator, amplifier, or other circuit. Primary inductor 150 may produce a magnetic field including magnetic field 130. The magnetic field 130 may be proportional to the current driven through inductor 150 such as I_MAIN 120A from port 180 through primary inductor 150 to port 185 in FIG. 1.

Figure 3C:
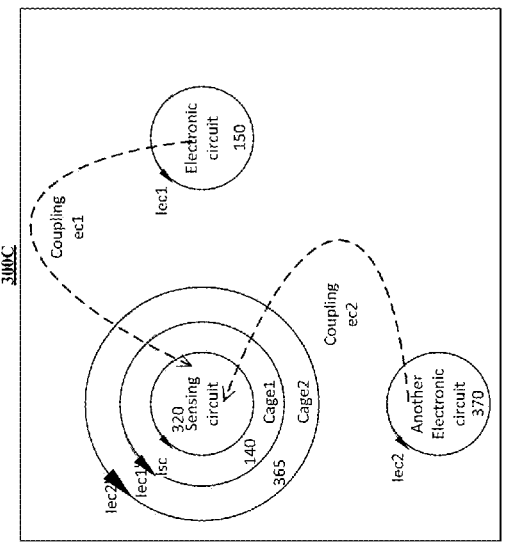
FIG. 3C depicts another example of an apparatus, in accordance with some example embodiments.
Figure 3B:
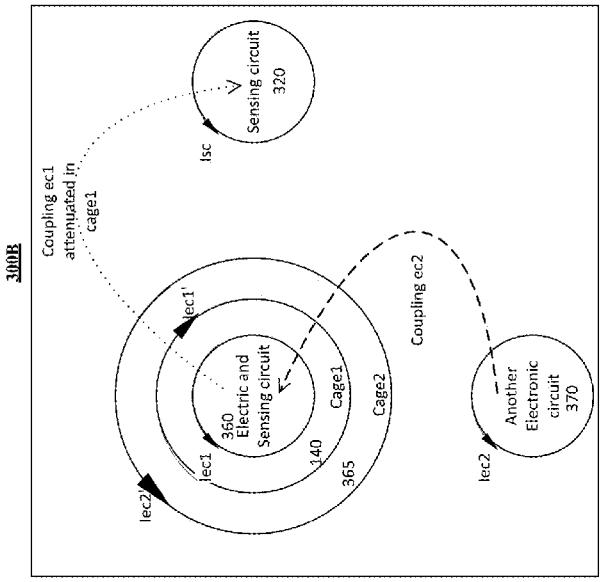
FIG. 3B depicts another example of an apparatus, in accordance with some example embodiments.
Figure 4:
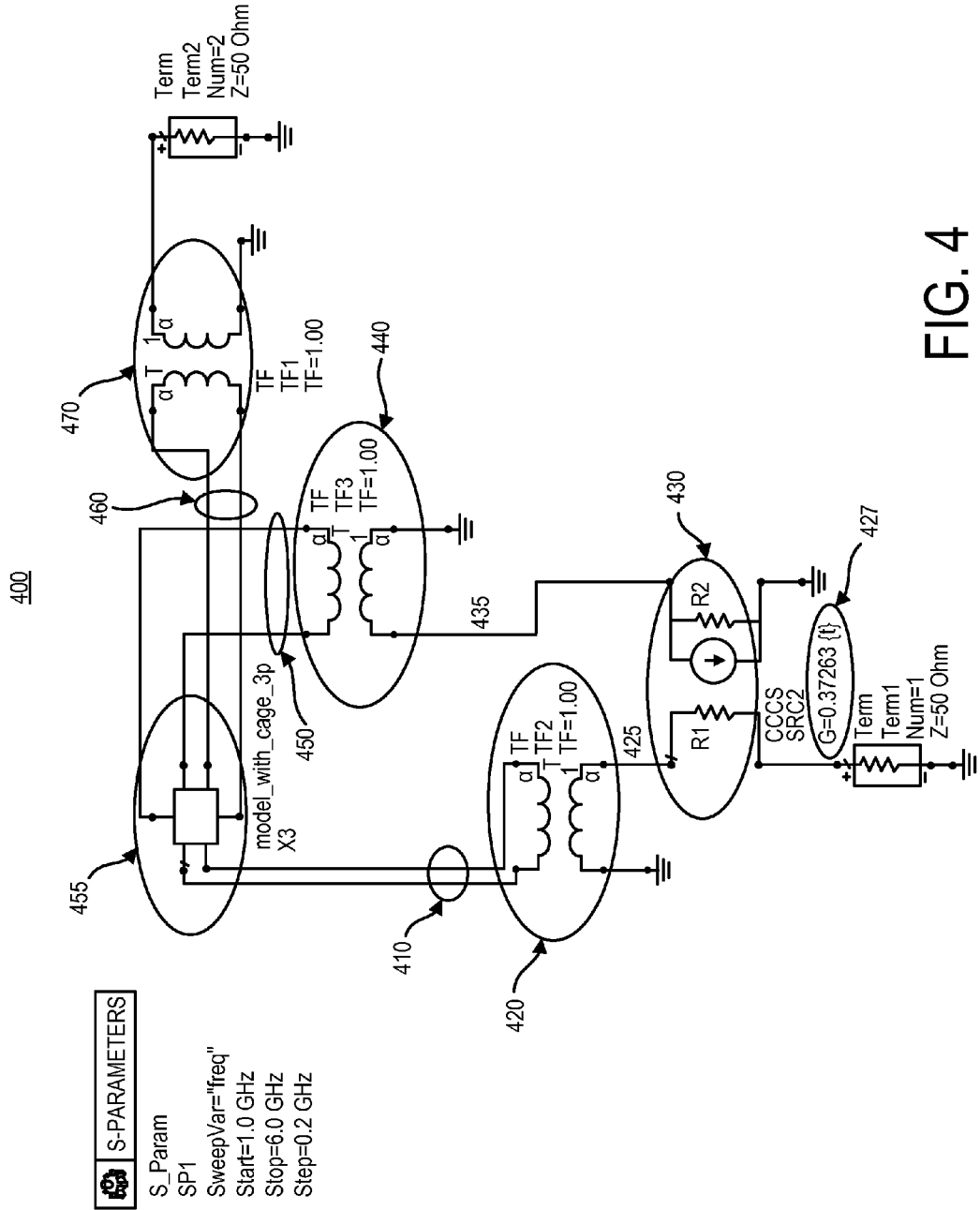
FIG. 4 depicts an example of a circuit model, in accordance with some example embodiments.
Figure 5:
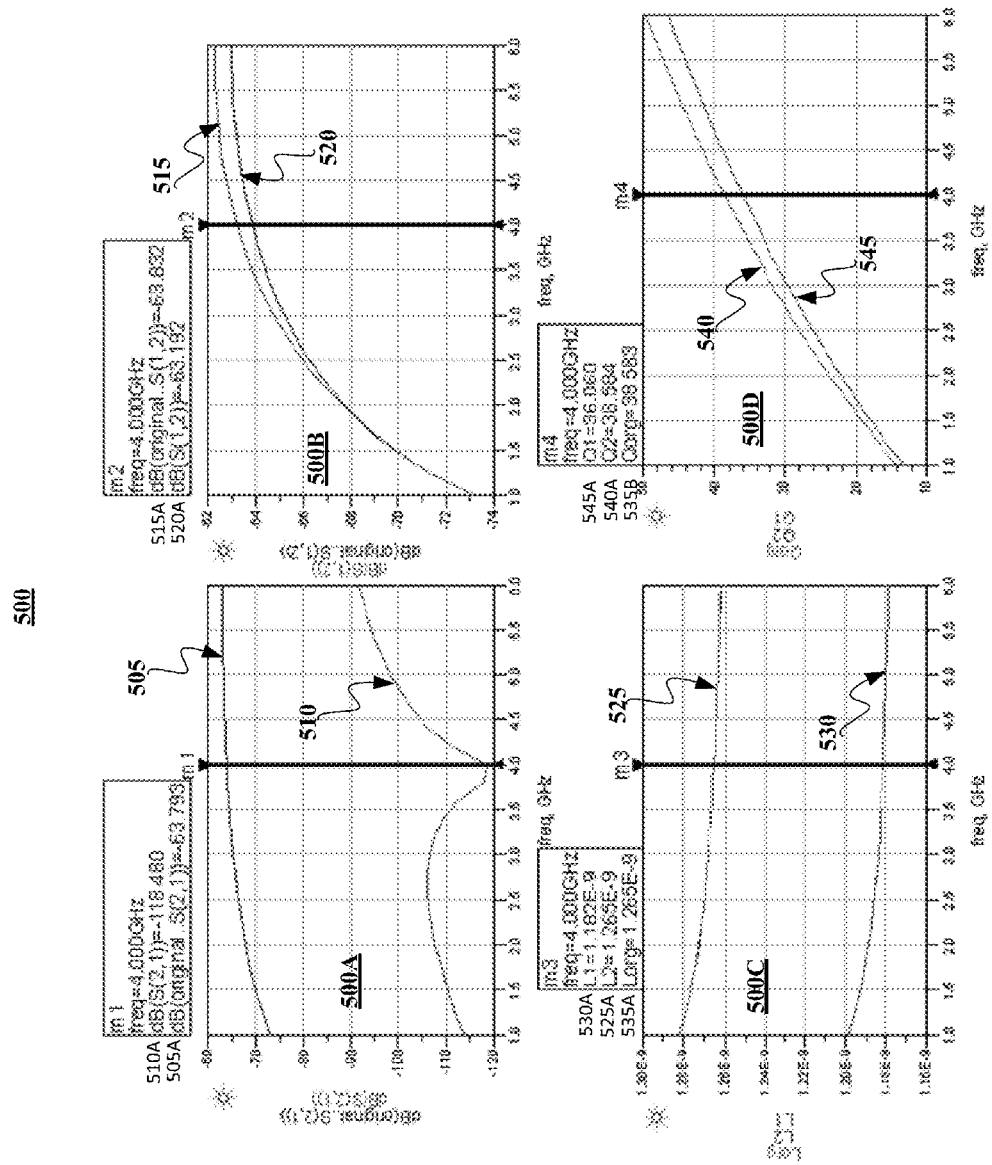
FIG. 5 depicts example plots of some performance parameters of an example circuit, in accordance with some example embodiments.

Input signal 240 that is phase shifted and amplitude adjusted may be used to drive cage 140. For example, input 240 may be phase shifted by phase shifter 220, amplitude adjusted by current controller 210, and driven into port 175 through cage 140 to port 170. The phase shift performed by phase shifter 220 and current amplitude adjustment performed at current controller 210 may cause a magnetic field 115 generated by cage 140 to cancel magnetic field 130 at a predetermined distance from inductor 150. For example, the phase shift and current amplitude may be adjusted to cancel the magnetic field at the location of another inductor. FIGS. 3-5 detail magnetic field cancellation from an inductor such as inductor 150 at the location of another inductor that is a predetermined distance away.

Figure 3A:
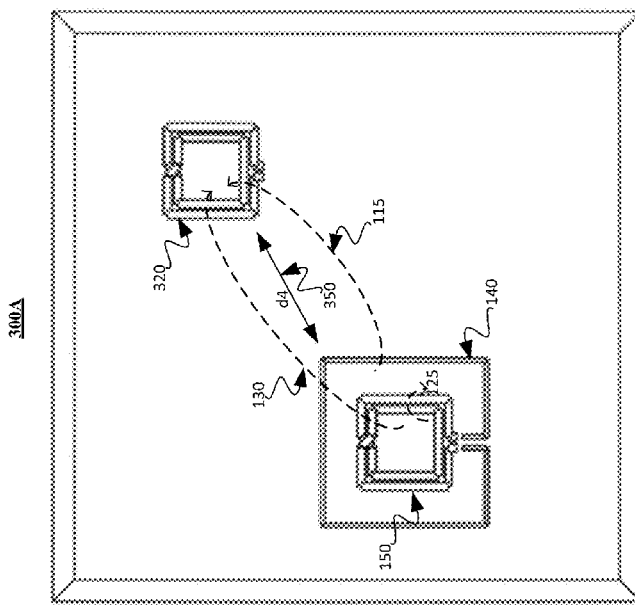
FIG. 3A depicts an example of an apparatus including a primary inductor, a cage, and a sensing inductor, in accordance with some example embodiments.

FIG. 3A depicts an example of an apparatus 300 including primary inductor 150, cage 140, and sensing inductor 320, in accordance with some example embodiments. Primary inductor 150 may be surrounded by cage 140 to cancel a magnetic field from primary inductor 150 at the location of sensing inductor 320. FIG. 3A also refers to FIGS. 1-2.

Primary inductor 150 may be any type of inductor such as a differential inductor with one or more crossovers 152 in accordance with FIG. 1. Primary inductor 150 may be any other type of inductor as well such as a spiral inductor. Primary inductor 150 may be surrounded by cage 140. Cage 140 may be a single loop as shown in FIG. 3A or may be formed by multiple loops in a differential inductor or loops of a spiral inductor or any other type of inductor. Sensing inductor 320 may be any type of inductor or other magnetic component such as a balun.

Cage 140 is driven in such a way as to cause cage magnetic field 115 to cancel magnetic field 130 from primary inductor 150 at inductor 320. In some example embodiments, cage 140 may be driven in accordance with FIG. 2 to cause magnetic cancellation of primary inductor magnetic field 130 by cage magnetic field 115. In some example embodiments, the phase shift at 220 and amplitude adjustment at 210 may be determined once or infrequently via sensing inductor 320. For example, a fixed phase shift to input signal 240 and a fixed amplitude adjustment may be determined by measurements at sensing inductor 320. The measurements may be determined once using laboratory test equipment or using a process executed by a processor associated with circuit 300 to determine the phase shift and amplitude adjustment needed to cancel magnetic field 130 by magnetic field 115 at sensing inductor 320. In some example embodiments, the phase shift and amplitude adjustment may be determined from time to time by the processor using sensing inductor 320. In some example embodiments, the phase shift and amplitude adjustment may be determined continuously by the processor using sensing inductor 320. In some example embodiments, the foregoing process may include the process of FIG. 6.

Referring to FIG. 3A, a time-varying phase shift at 220 and current adjustment at 210 to an input signal such as input 240 may be determined, in some example embodiments, by sensing the magnetic field via a current induced at sensing inductor 320. Time-varying induced current in sensing inductor 320 may be fed back to adjust the phase shift at 220 and to adjust the current from current controller 210 supplying current to cage 140. In some example embodiments, the frequency of the input signal 240 may be time-varying due to modulation of the input signal to carry information. The modulated input 240 may cause a magnetic field from primary inductor 150 to follow the time-varying input. To cancel the time-varying magnetic field from primary inductor 150, sensing inductor 320 may provide time-varying feedback to adjust the phase at 220 and current amplitude at 210.

FIGS. 3B and 3C depict additional configurations of a sensing inductor 320, cage 140, and primary inductor 150, and additional cages, sensing circuits, and/or inductors/circuits.

FIG. 3B depicts at 300B an inductor/circuit 360 that may be used as a primary inductor and a sensing inductor. For example, cage 140 may surround inductor/circuit 360. Cage 140 may cancel the magnetic field from 360 at sensing inductor 320. The magnetic field from another circuit/inductor 370 may be cancelled at inductor/circuit 360 by a second cage, cage 365. The second cage 365 may also surround inductor/circuit 360.

FIG. 3C depicts at 300C cages surrounding a sensing inductor. Cage 140 may surround sensing circuit 320. The magnetic field from inductor/circuit 150 may be cancelled by cage 140 at sensing circuit 320. Cage 365 may also surround sensing circuit 320. Cage 365 may cancel the magnetic field at sensing circuit 320 from another inductor/circuit 370.

In some example embodiments, an apparatus may provide a means for generating a first magnetic field from a current in an electronic circuit. The means for generating the first magnetic field may include any type of planar inductor, multi-layer inductor, or any other type of inductor, or any type of transformer, or any other magnetic device. The apparatus may further provide a means for sensing the first magnetic field. The means for sensing the first magnetic field may include any type of planar inductor, multi-layer inductor, or any other type of inductor, or any type of transformer, or any other magnetic device. The apparatus may further provide a means for generating a cage current. The cage current may be generated by any type of amplifier, driver, current source, voltage source, semiconductor device, phase shifter, or any other circuit. The apparatus may provide a means for causing, by the cage circuit, cancellation of the at least the first portion of the magnetic field at the sensing circuit. The cage circuit may include any type of planar inductor, multi-layer inductor, or any other type of inductor, or any type of transformer, or any other magnetic device.

FIG. 4 depicts an example of a circuit model 400, in accordance with some example embodiments. At 455, a three-port circuit model of coupled inductors such as inductors 150, 140, and 320 in FIGS. 3A-3C may be determined. For example, the three-port model may be representative of currents into and out of coupled inductors across a range of frequencies. For example, currents flowing through 410 may be representative of current in an in-circuit inductor such as inductor 150. The current at 450 may be representative of current driven into cage 140 by a driver. The current at 460 may be representative of the current at a sensing inductor such as sensing inductor 320. FIG. 4 also refers to FIGS. 1-3.

At 455, a three-port circuit model may be determined of coupled inductors such as primary inductor 150, cage 140, and sensing inductor 320 in FIGS. 3A-3C. The three-port model may be determined using circuit simulation of the layout of the inductors, properties of any dielectric materials in proximity to the inductors, properties of the conductors used in the inductors, and active circuits such as inductive driver, 230, current controller 210, and/or phase shifter 220. Other active circuits may also be included in the three-port model. In some embodiments, the three-port model may be determined by fabricating the inductors and circuits followed by making three-port measurements on the fabricated inductors and circuits. In some embodiments, the three-port model may be determined using lumped element circuit tools. Other methods may also be used.

The three-port model may be representative across a range of frequencies of currents into and out of the coupled inductors and voltages across the inductors. For example, currents flowing through lines 410 may be representative of current in an inductor such as inductor 150. In circuit model 400, the current through inductor 150 may sampled using transformer 420. The same amount of current that flows at 410 also flows at 425 (the transformer is 1:1). A current controlled current source 430 may provide a current that is amplitude adjusted compared to current 425. A fixed amplification value may be used and the value may less than unity. The output current 435 from current controlled current source 430 may be fed into transformer 440. The same current that flows at 435 also flows at 450. The current 450 is representative of the cage current 110. Current flowing at 460 is representative of the current in the sensing inductor 320. By adjusting the gain factor 427, the cage current amplitude may be adjusted until the current at 460 is zero or close to zero. When the current at 460 is zero or close to zero, the magnetic field due to inductor 150 at the sensing inductor 320 is cancelled or nearly cancelled. In the example of FIG. 4, a gain value of 0.37263 may cause a zero or nearly zero current at 460.

FIG. 5 depicts example plots of some performance parameters of an example circuit, in accordance with some example embodiments. At 500A, a plot of the coupling from a primary inductor to a sensing inductor is shown for an example circuit. At 500B, a plot of the coupling from the sensing inductor to the primary inductor is shown for an example circuit. At 500C, examples of plots of the inductances of a primary inductor and a sensing inductor are shown. At 500D, examples of plots of the quality factor for a primary inductor and a sensing inductor are shown. FIG. 5 also refers to FIGS. 1-4.

At 500A, a plot of the coupling from a primary inductor to a sensing inductor is shown for an example circuit such as the circuit shown at FIG. 3A and/or the circuit model at FIG. 4. The plot at 505 depicts the coupling between 1.0 GHz (gigahertz) and 6.0 GHz from the primary inductor such as inductor 150 to the sensing inductor such as inductor 320 when no current is flowing in the cage such as cage 140. At 510, the coupling between 1.0 GHz and 6.0 GHz from the primary inductor to the sensing inductor is shown when the cage current is applied in accordance with FIGS. 1-4. In this example, at 4.0 GHz, the cage 140 causes the coupling between the primary inductor to the sensing inductor to be reduced by approximately 55 dB (decibels).

At 500B, a plot of the coupling from the sensing inductor to the primary inductor is shown for an example circuit. The plot at 515 depicts the coupling between 1.0 GHz and 6.0 GHz from the sensing inductor 320 to the primary inductor such as inductor 150 when no current is flowing in the cage such as cage 140. At 520, the coupling between 1.0 GHz and 6.0 GHz from the sensing inductor to the primary inductor is shown when the cage current is applied in accordance with FIGS. 1-4. In this example, at 4.0 GHz, the cage 140 may have little effect on the coupling from the sensing inductor to the primary inductor. The coupling may be nearly unchanged because the cage current may be determined to cancel the magnetic field from the primary inductor not to cancel a magnetic field from the sensing inductor.

At 500C, examples of plots of the inductances of a primary inductor and a sensing inductor are shown. The plot at 525 shows the inductance of an inductor such as inductor 150 between the frequencies of 1.0 GHz and 6.0 GHz with no cage current flowing such as no cage current 110 flowing in cage 140. In some example embodiments, the inductance may vary over frequency slightly due to the effects of parasitic components in the inductor layout. The plot at 530 shows the inductance of an inductor such as inductor 150 between the frequencies of 1.0 GHz and 6.0 GHz with a cage current such as cage current 110 flowing in accordance with FIGS. 1-4. In this example, the slight change of inductance over frequency may be due to parasitic components in the inductor layout and/or driving circuits for the inductor 150 or cage 140. In some example embodiments, the inductance of the inductor 150 may be reduced due to the magnetic field generated by cage current 110. In this example, the inductance 525A of inductor 150 may be 1.26 Nanohenries at 4.0 GHz with no cage current and the inductance 530A of inductor 150 may be 1.18 Nanohenries with cage current 110 flowing in accordance with FIGS. 1-4. The inductance of inductor 150 with without a cage 140 (and no cage current 110) may be about 1.26 Nanohenries.

At 500D, examples of plots of the quality factor of a primary inductor and a sensing inductor are shown. The plot at 540 shows the quality factor of an inductor such as inductor 150 between the frequencies of 1.0 GHz and 6.0 GHz with no cage current flowing such as no cage current 110 flowing in cage 140. In some example embodiments, the quality factor may vary over frequency slightly due to the effects of parasitic components in the inductor layout. For example, losses in the substrate material and/or losses due to the skin effect may affect the quality factor over frequency. The plot at 545 shows the quality factor of an inductor such as inductor 150 between the frequencies of 1.0 GHz and 6.0 GHz with a cage current such as cage current 110 flowing in accordance with FIGS. 1-4. In this example, the quality factor 540A of inductor 150 may be approximately 38.6 at 4.0 GHz with no cage current and the quality factor 545A of inductor 150 may be approximately 36.1 with cage current 110 flowing in accordance with FIGS. 1-4. In this example, the quality factor of inductor 150 without a cage 140 (and no cage current 110) may be approximately 38.6. Although FIG. 5 depicts plots with example values, other values may be realized as well.

Figure 6:
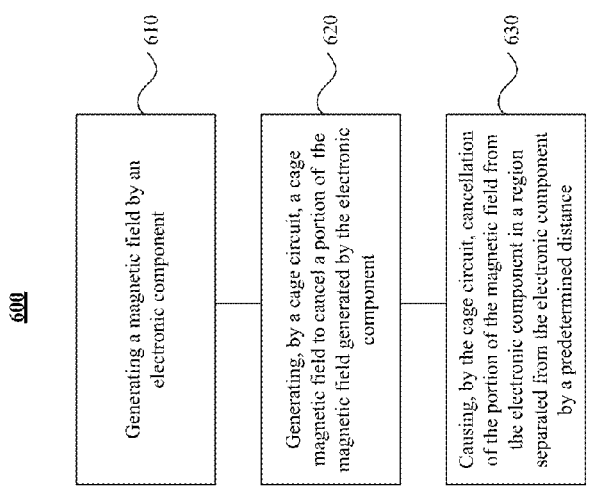
FIG. 6 depicts a process, in accordance with some example embodiments.

FIG. 6 depicts a process, in accordance with some example embodiments. At 610, the process may include generating a magnetic field by an electronic component. At 620, the process may include generating, by a cage circuit, a cage magnetic field to cancel the magnetic field generated by the electronic component. At 630, the process may include causing, by the cage circuit, cancellation of the magnetic field from the electronic component in a region separated from the electronic component by a predetermined distance. FIG. 6 also refers to FIGS. 1-5.

At 610, the process may include generating a magnetic field by an electronic component, in accordance with some example embodiments. For example, the electronic component may include an inductor such as inductor 150 which may be driven by an inductive driver such as inductive driver 230 as part of a circuit such as a local oscillator, amplifier, or other circuit. Inductor 150 may generate magnetic fields 125 and 130. Magnetic field 125 may be representative of a magnetic field and/or flux density near a magnetic device such as inductor 150 or a balun or transformer. Magnetic field 130 may be representative of the magnetic field and flux density some distance away from the magnetic device such as at the location of another device at which magnetic field cancellation occurs due to cage 140.

At 620, the process may include generating, by a cage circuit such as a conductive loop, a cage magnetic field such as magnetic field 115 due to a cage current such as current 110, in accordance with some example embodiments. For example, a cage circuit may include cage 140 comprising a loop surrounding an inductor such as primary inductor 150. Current driven through cage 140 may generate a magnetic field 115 in such a way as to cancel the magnetic field 130 at a particular location spaced some distance away from primary inductor 150 and cage 140. For example, in FIG. 3A cage current 110 may be driven through cage 140 in a manner to cause a cancellation of magnetic field 130 at sensing inductor 320. The cage current 110 may be determined in accordance with FIGS. 1-4.

At 630, the process may include causing, by the cage circuit, cancellation of the portion of the magnetic field from the electronic component in a region separated from the electronic component by a predetermined distance, in accordance with some example embodiments. For example, in FIG. 3A cage 140 may cause cancellation of magnetic field 130 at sensing inductor 320 positioned a distance $d_4$ 350 away from inductor 150 and cage 140. In some example embodiments, sensing inductor 320 may provide a signal representative of the magnetic field 130 at 320 that may be used to adjust the current in cage 140 to cause a reduction in magnetic field 130 at 320. For example, a signal from sensing inductor 320 may be provided to phase shifter 220 and current controller 210 in FIG. 2 (connection to 320 not shown). The signal from sensing inductor 320 may cause phase shifter 210 and current controller 220 to adjust the amplitude and phase of current in cage 140 to cause a reduction in the magnetic field from primary inductor 150 at sensing inductor 320. In some example embodiments, an input signal 240 may be adjusted by a fixed amplitude adjustment and a fixed phase adjustment as shown in FIGS. 2 and 4 and driven through cage 140. In some example embodiments, a signal from another circuit such as a local oscillator that may be affected by magnetic field 130 may be used to adjust cage current 110 to reduce magnetic field 130 at the other circuit.

Figure 7:
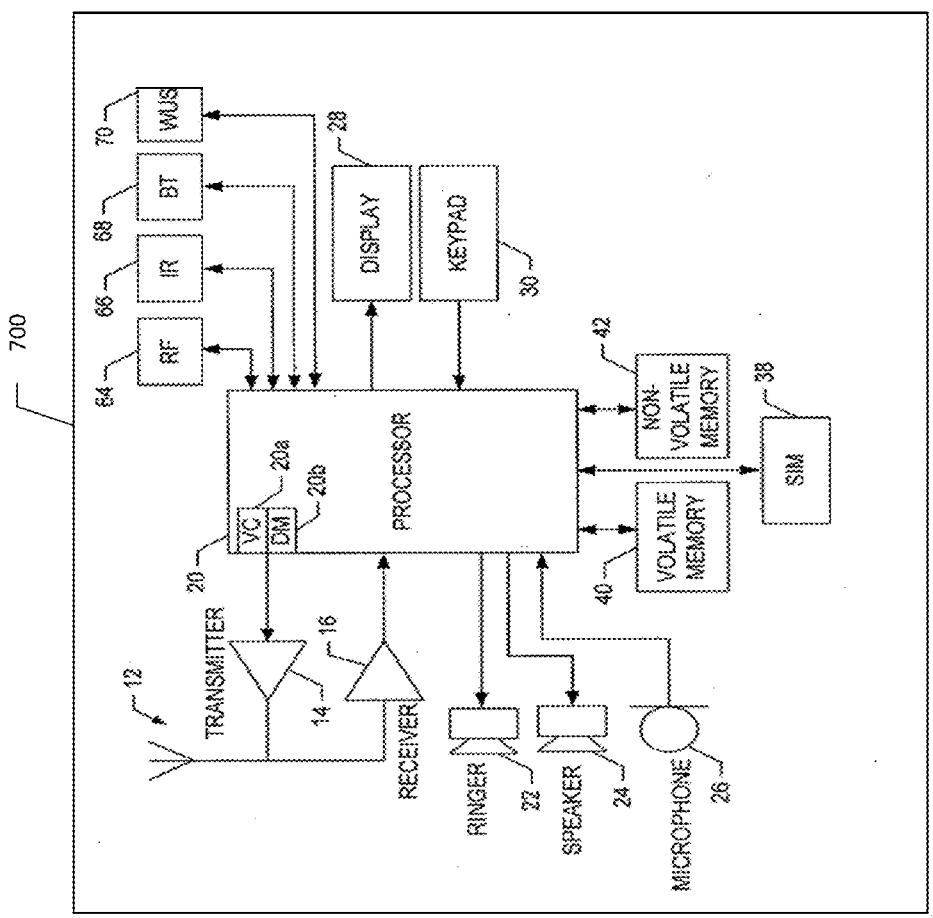
FIG. 7 depicts another example of an apparatus, in accordance with some example embodiments.

FIG. 7 depicts an example of an apparatus 700, in accordance with some example embodiments. The apparatus 700 may comprise a user equipment such as user equipment 120 and/or a wireless access point such as wireless access points 110A-E. Apparatus 700 (or portions thereof) may include one or more primary inductors 150 and cages 140 consistent with FIGS. 1-6. For example, primary inductor 150 and/or cage 140 may be included in transmitter 14, receiver 16, antenna 12, short-range radio frequency transceiver 64, Bluetooth transceiver 68, and/or USB transceiver 70. Primary inductor 150 and/or cage 140 may be included in other circuits in apparatus 700 as well. One or more sensing inductors 320 consistent with FIGS. 1-6 may also be included.

In some example embodiments, apparatus 700 may also include a radio communication link to a cellular network, or other wireless network. The apparatus 700 may include at least one antenna 12 in communication with a transmitter 14 and a receiver 16. Alternatively transmit and receive antennas may be separate.

The apparatus 700 may also include a processor 20 configured to provide signals to and from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 130 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Apparatus 700 may include a location processor and/or an interface to obtain location information, such as positioning and/or navigation information. Accordingly, although illustrated in FIG. 7 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as, Institute of Electrical and Electronics Engineers (IEEE) 802.11, 802.16, and/or the like. In addition, these signals may include speech data, user generated data, user requested data, and/or the like.

The apparatus 700 may be capable of operating with one or more air interface standards, communication protocols, modulation types, access types, and/or the like. For example, the apparatus 700 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 700 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 700 may be capable of operating in accordance with 2.5G wireless communication protocols General Packet Radio Service (GPRS), Enhanced Data GSM Environment (EDGE), and/or the like. Further, for example, the apparatus 700 may be capable of operating in accordance with 3G wireless communication protocols, such as, Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 130 may be additionally capable of operating in accordance with 3.9G wireless communication protocols, such as, Long Term Evolution (LTE), Evolved Universal Terrestrial Radio Access Network (E-UTRAN), and/or the like. Additionally, for example, the apparatus 700 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 700. For example, the processor 20 may comprise a digital signal processor device, a microprocessor device, an analog-to-digital converter, a digital-to-analog converter, and/or the like. Control and signal processing functions of the apparatus 700 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 700 to perform actions. For example, processor 20 may be capable of operating a connectivity program, such as, a web browser. The connectivity program may allow the apparatus 700 to transmit and receive web content, such as location-based content, according to a protocol, such as, wireless application protocol, WAP, hypertext transfer protocol, HTTP, and/or the like.

Apparatus 700 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as, the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 700 may include a battery for powering various circuits related to the mobile terminal, for example, a circuit to provide mechanical vibration as a detectable output. The user input interface may comprise devices allowing the apparatus 700 to receive data, such as, a keypad 30 (which can be a virtual keyboard presented on display 28 or an externally coupled keyboard) and/or other input devices.

Moreover, the apparatus 700 may include a short-range radio frequency (RF) transceiver and/or interrogator 64, so data may be shared with and/or obtained from electronic devices in accordance with RF techniques. The apparatus 700 may include other short-range transceivers, such as an infrared (IR) transceiver 66, a Bluetooth (BT) transceiver 68 operating using Bluetooth wireless technology, a wireless universal serial bus (USB) transceiver 70, and/or the like.

The Bluetooth transceiver 68 may be capable of operating according to low power or ultra-low power Bluetooth technology, for example, Wibree, radio standards. In this regard, the apparatus 700 and, in particular, the short-range transceiver may be capable of transmitting data to and/or receiving data from electronic devices within a proximity of the apparatus, such as within 10 meters. The apparatus 700 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 700 may comprise memory, such as, a subscriber identity module (SIM) 38, a removable user identity module (R-UIM), and/or the like, which may store information elements related to a mobile subscriber. In addition to the SIM, the apparatus 700 may include other removable and/or fixed memory. The apparatus 700 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 700. The functions may include one or more of the operations disclosed herein including the process flow of FIG. 6, and the like. The memories may comprise an identifier, such as, an international mobile equipment identification (IMEI) code, capable of uniquely identifying apparatus 700. In the example embodiment, the processor 20 may be configured using computer code stored at memory 40 and/or 42 to provide the operations disclosed with respect to the processes described with respect to FIGS. 1-6, and the like.

Some of the embodiments disclosed herein may be implemented in software, hardware, application logic, or a combination of software, hardware, and application logic. The software, application logic, and/or hardware may reside in memory 40, the control apparatus 20, or electronic components disclosed herein, for example. In some example embodiments, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIGS. 1-6. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed herein (see, for example, the process 600).

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Without in any way limiting the scope, interpretation, or application of the claims appearing below, a technical effect of one or more of the example embodiments disclosed herein is reducing magnetic coupling/interference from an inductor to other electronic circuit elements. Reduced magnetic coupling may further allow more compact circuits to be produced.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed is:

1. A method comprising:
    generating a first magnetic field from a current in an electronic circuit;
    sensing the first magnetic field by a sensing circuit separated from the electronic circuit by a predetermined distance;
    generating a cage current from the current and at least one of a phase shift or an amplitude shift applied to the current, wherein the cage current generates a second magnetic field in a cage circuit to cancel at least a portion of the first magnetic field at the sensing circuit; and causing, by the cage circuit, cancellation of the at least the portion of the first magnetic field from the electronic circuit at the sensing circuit.

2. The method of claim 1, wherein the electronic circuit comprises a first inductor, wherein the cage circuit comprises a second inductor, wherein the sensing circuit comprises a third inductor, and wherein the second inductor physically circumscribes the first inductor or the third inductor.

3. The method of claim 2, wherein the at least one of the gain adjustment or the phase adjustment comprise a fixed gain adjustment value or a fixed phase adjustment value.

4. The method of claim 2, wherein the at least one of the gain adjustment and the phase adjustment comprise a time-varying gain adjustment value or a time-varying phase adjustment value.

5. The method of claim 1, wherein the electronic circuit is at least one of a spiral inductor, an interwound, a differential spiral inductor, an octagonal inductor, any other planar inductor, or any transformer.

6. The method of claim 1, wherein the electronic circuit comprises a plurality of inductors.

7. The method of claim 1, further comprising:
generating at least another cage current from another current in another electronic circuit and at least another phase shift or another amplitude shift applied to the other current, wherein the other current generates a fourth magnetic field, and wherein the at least another cage current generates at least a third magnetic field in at least another cage circuit to cancel at least another portion of the fourth magnetic field at the sensing circuit; and causing, by the at least another cage circuit, cancellation of the at least the other portion of the fourth magnetic field at the sensing circuit.

8. An apparatus comprising:
an electronic circuit to generate a first magnetic field from a current in the electronic circuit;
a sensing circuit separated from the electronic circuit by a predetermined distance to sense the first magnetic field;
a cage circuit to cancel at least a portion of the first magnetic field at the sensing circuit by generating a cage current from the current and at least one of a phase shift or an amplitude shift applied to the current, wherein the cage current generates a second magnetic field, wherein the cage circuit causes cancellation of the at least the portion of the first magnetic field from the electronic circuit at the sensing circuit.

9. The apparatus of claim 8, wherein the electronic circuit comprises a first inductor, wherein the cage circuit comprises a second inductor, wherein the sensing circuit comprises a third inductor, and wherein the second inductor physically circumscribes the first inductor or the third inductor.

10. The apparatus of claim 9, wherein the at least one of the gain adjustment or the phase adjustment comprise a fixed gain adjustment value or a fixed phase adjustment value.

11. The apparatus of claim 9, wherein the at least one of the gain adjustment and the phase adjustment comprise a time-varying gain adjustment value or a time-varying phase adjustment value.

12. The apparatus of claim 8, wherein the electronic circuit is at least one of a spiral inductor, a differential spiral inductor, an octagonal inductor, any other planar inductor, or any transformer.

13. The apparatus of claim 8, wherein the electronic circuit comprises a plurality of inductors.

14. The apparatus of claim 8, further comprising:
at least another cage circuit passing at least another cage current generated from another current in another electronic circuit and at least another phase shift or another amplitude shift applied to the other current in the other electronic circuit, wherein the other current generates a fourth magnetic field, wherein the at least another cage current generates at least a third magnetic field to cancel at least another portion of the fourth magnetic field at the sensing circuit, and wherein the at least another cage circuit causes cancellation of the at least the other portion of the fourth magnetic field at the sensing circuit.

15. A non-transitory computer-readable medium encoded with instructions that, when executed by at least one processor, cause operations comprising:
generating a first magnetic field from a current in an electronic circuit;
sensing the first magnetic field by a sensing circuit separated from the electronic circuit by a predetermined distance;
generating a cage current from the current and at least one of a phase shift or an amplitude shift applied to the current, wherein the cage current generates a second magnetic field in a cage circuit to cancel at least a portion of the first magnetic field at the sensing circuit; and
causing, by the cage circuit, cancellation of the at least the portion of the first magnetic field from the electronic circuit at the sensing circuit.

* * * * *